US008860002B2

(12) United States Patent
Tendulkar et al.

(10) Patent No.: US 8,860,002 B2
(45) Date of Patent: Oct. 14, 2014

(54) LIMITED MAXIMUM FIELDS OF ELECTRODE-SWITCHING LAYER INTERFACES IN RE-RAM CELLS

(71) Applicants: Intermolecular Inc., San Jose, CA (US); Kabushiki Kaisha Toshiba, Tokyo (JP); SanDisk 3D LLC, Milpitas, CA (US)

(72) Inventors: Mihir Tendulkar, Mountain View, CA (US); Imran Hashim, Saratoga, CA (US); Tim Minvielle, San Jose, CA (US); Yun Wang, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/721,450

(22) Filed: Dec. 20, 2012

(65) Prior Publication Data

US 2014/0175362 A1    Jun. 26, 2014

(51) Int. Cl.
    *H01L 45/00*    (2006.01)
(52) U.S. Cl.
    CPC .................................. *H01L 45/1253* (2013.01)
    USPC ............................................................ 257/4
(58) Field of Classification Search
    CPC ....................................... H01L 45/145–45/147
    USPC ............................................................ 257/4
    See application file for complete search history.

(56) References Cited

U.S. PATENT DOCUMENTS

| 5,383,088 | A | 1/1995 | Chapple-Sokol et al. |
| 6,193,871 | B1 | 2/2001 | Coates |
| 7,067,862 | B2 | 6/2006 | Rinerson et al. |
| 7,402,456 | B2 | 7/2008 | Zhuang |
| 7,791,141 | B2 | 9/2010 | Meijer |
| 7,897,453 | B2 | 3/2011 | Chen |
| 7,999,266 | B2 | 8/2011 | Xianyu |
| 8,183,553 | B2 | 5/2012 | Phatak |
| 8,354,660 | B2 | 1/2013 | Sekar |
| 2004/0159828 | A1 | 8/2004 | Rinerson |
| 2005/0156221 | A1* | 7/2005 | Kiyotoshi ..................... 257/306 |
| 2006/0105355 | A1 | 5/2006 | Maurer |
| 2008/0089121 | A1* | 4/2008 | Aochi et al. .................. 365/163 |

(Continued)

OTHER PUBLICATIONS

Kim et al.; Anodeinterface localized filamentary mechanism in resistive switching of TiO2 thin films; Jul. 6, 2007; American Institute of Physics; Applied Physics Letters Jul. 6, 2007 pp. 01290710129073 vol. 91.

(Continued)

*Primary Examiner* — Armando Rodriguez
*Assistant Examiner* — Mohammed R Alam

(57) ABSTRACT

Provided are ReRAM cells, each having at least one interface between an electrode and a resistive switching layers with a maximum field value of less than 0.25. The electrode materials forming such interfaces include tantalum nitrides doped with lanthanum, aluminum, erbium yttrium, or terbium (e.g., $Ta_X(Dopant)_YN$, where X is at least about 0.95). The electrode materials have low work functions (e.g., less than about 4.5 eV). At the same time, the resistive switching materials have high relative dielectric permittivities (e.g., greater than about 30) and high electron affinities (greater than about for 3.5 eV). Niobium oxide is one example of a suitable resistive switching material. Another electrode interfacing the resistive switching layer may have different characteristics and, in some embodiments, may be an inert electrode.

19 Claims, 6 Drawing Sheets

(56) References Cited

U.S. PATENT DOCUMENTS

| | | | |
|---|---|---|---|
| 2008/0224236 A1* | 9/2008 | Ren et al. | 257/407 |
| 2008/0272433 A1* | 11/2008 | Alshareef et al. | 257/347 |
| 2010/0078758 A1* | 4/2010 | Sekar et al. | 257/530 |
| 2010/0167463 A1* | 7/2010 | Sung | 438/104 |
| 2010/0232091 A1* | 9/2010 | Kaneda et al. | 361/528 |
| 2011/0175050 A1 | 7/2011 | Chien et al. | |
| 2011/0227020 A1 | 9/2011 | Sekar | |
| 2012/0205610 A1 | 8/2012 | Phatak | |

OTHER PUBLICATIONS

Kim, S., et al.; Dielectric and Electrode Thin Films for StackCell Structured DRAM Capacitors with Sub 50nnn Design Rules; Sep. 19, 2007; EMRS; Warsaw University of Technology.

Seo, S., et al.; Electrode dependence of resistance switching in polycrystalline NiO films; Jan. 1, 2005; American Institute of Physics; Applied Physics Letters 87 263507 2005.

Sim, H., et al.; ResistanceSwitching Characteristics of Polycrystalline $Nb_2O_5$ for Nonvolatile Memory Application; May 1, 2005; IEEE; Electron Device Letters vol. 26 May 5 pp. 292294.

Jo, Y. et al.; Reverse Resistance Switching in Polycrystalline $Nb_2O_5$ Films; Jan. 1, 2010; Korea Basic Science institute; Thin Solid Films pp. 56765678.

Choi, K., et al.; Initial Growth of Interfacial Oxide During Deposition of $HfO_2$ on Silicon; Jul. 12, 2004; Texas Tech University; Applied Physics Letters vol. 85 No. 2 pp. 215218.

Netzer, F.; Interfacial Oxide Layers at the MetalOxide Phase Boundary; Jan. 1, 2002; World Scientific Publishing Company; Surface Review and Letters vol. 9 Nos. 3 and 4 pp. 15531563.

Fillot, F., et al.; Investigations of the Interface Stability in $HfO_2$Metal Electrodes; Jan. 1, 2003; STM-AMAT; Microelectronic Engineering pp. 384391.

Lichtenwalner et al.; Lanthanum silicate gate dielectric stacks with subnanometer equivalent oxide thickness utilizing an interfacial silica consuption reaction; Jul. 26, 2005; American Institute of Physics; Unknown.

* cited by examiner

US 8,860,002 B2

LIMITED MAXIMUM FIELDS OF ELECTRODE-SWITCHING LAYER INTERFACES IN RE-RAM CELLS

TECHNICAL FIELD

The present invention relates generally to non-volatile memory and more specifically to resistive random access memory (ReRAM) cells having interfaces between their electrodes and resistive switching layers that have limited maximum fields.

BACKGROUND

Nonvolatile memory is computer memory capable of retaining the stored information even when unpowered. Nonvolatile memory is typically used for the task of secondary storage or long-term persistent storage and may be used in addition to volatile memory, which losses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in some computer systems. However, transistor-based flash memory is often inadequate to meet the requirements of various applications. New types of memory, such as resistive random access memory (ReRAM), are being developed to meet these demands and requirements.

SUMMARY

Provided are ReRAM cells, each having at least one interface between an electrode and a resistive switching layers with a maximum field value of less than 0.25 eV. The electrode materials forming such interfaces include tantalum nitrides doped with lanthanum, aluminum, erbium yttrium, or terbium (e.g., $Ta_X(Dopant)_YN$, where X is at least about 0.95). The electrode materials have low work functions (e.g., less than about 4.5 eV). At the same time, the resistive switching materials have high dielectric permittivities (e.g., greater than about 30) and high electron affinities (greater than about for 3.5 eV). Niobium oxide is one example of a suitable resistive switching material. Another electrode interfacing the resistive switching layer may have different characteristics and, in some embodiments, may be an inert electrode.

In some embodiments, a resistive random access memory cell includes a first layer, a second layer, and a first interface formed by the first layer and the second layer. The first layer includes a doped tantalum nitride having a first work function (WF). The second layer includes a resistive switching material having an electronic affinity (X) and a dielectric permittivity ($\in_S$). The maximum field of the first interface has a value of less than 0.25. For purposes of this disclosure, the maximum field of an interface is calculated using the following formula $E_{MAX}=|2*(WF-X)/\in_S|^{1/2}$. A dopant of the doped tantalum nitride may be one of lanthanum, aluminum, erbium yttrium, or terbium. The resistive switching may include niobium oxide. In some embodiments, the doped tantalum nitride of the first layer is represented by a general formula of $Ta_X(Dopant)_YN$, where X is at least about 0.95. The work function of the doped tantalum nitride may be less than about 4.5 eV. The relative dielectric permittivity of the resistive switching material may at least about 30. In some embodiments, the electron affinity of the resistive switching material is at least about 3.5 eV.

In some embodiments, the resistive random access memory cell also includes a third layer formed from an electrode material having a second work function and a second interface formed by the second layer and the third layer. The maximum field of the second interface has a value of less than 0.25. The electrode material of the third layer may include one of n-doped poly-silicon, titanium nitride, or tantalum nitride, or, more specifically, doped tantalum nitride. The work function of the doped tantalum nitride used in the third layer may be between about 4.2 and 4.4. The resistive switching material in this example may be niobium oxide.

In some embodiments, the first layer has a thickness of between about 5 Angstroms and 1,000 Angstroms. The second layer has a thickness of between about 10 Angstroms and 100 Angstroms.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION

Figure 1A:
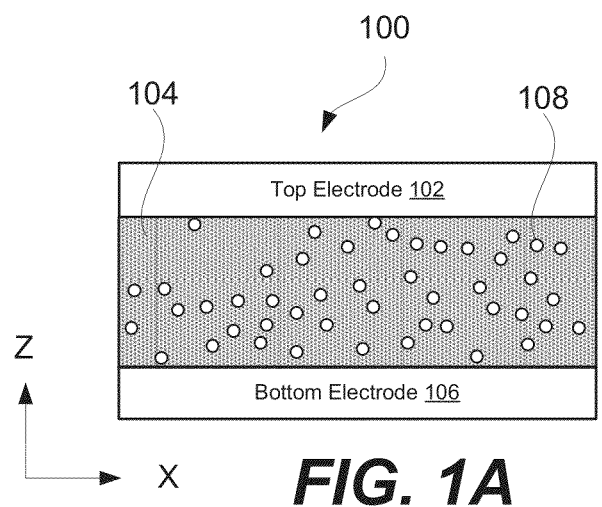
FIGS. 1A and 1B illustrate schematic representations of a nonvolatile memory element in its high resistive state (HRS) and low resistive state (LRS), in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

INTRODUCTION

A ReRAM cell exhibiting resistive switching characteristics generally includes multiple layers formed into a stack. This stack is sometimes referred to as a Metal-Insulator-Metal (MIM) stack. The stack includes two conductive layers operating as electrodes. These conductive layers may include metals and other conductive materials, such as tantalum nitride (e.g., doped tantalum nitride), titanium nitride, doped silicon, or some other materials. These conductive layers are identified as "M" in the above naming convention even though electrode materials may not necessarily include metals or exhibit metal-like properties. The stack also includes an insulator layer provided in between the electrodes. The insulator layer is indentified as "I" in the above naming convention. The insulator layer exhibits resistive switching properties characterized by different resistive states. Some examples of suitable resistive switching materials include niobium oxide and hafnium oxide. These resistive states of the insulator layer may be used to store one or more bits of information. The difference in the resistive states may be attributed to changes in the insulator layer, changes at one or both interfaces between the insulator layer and metal layers, or both types of changes.

Without being restricted to any particular theory, it is believed that the resistive switching properties of the insulator layer depend on defect concentrations and mobility inside this layer as well as through the interface with at least one electrode, which is often referred to as an active electrode. The other electrode may be inert, which means that it does not participate in defect exchange or any other related material exchange with the resistive switching layer. As such, the performance of the ReRAM cell may degrade as the concentration and location of the defects in the resistive switching layer change overtime during operation of the ReRAM cell. This change may be influenced by electric fields generated during setting, resetting, and reading operations as further described below with reference to FIGS. 1A-B and FIGS. 2A-B. Stability of the resistive switching layer against intermixing of various components within the layer (including the defects) and other like phenomena that may occur under voltage stresses during switching and reading needs to be controlled to ensure robust performance of the ReRAM cell.

Provided are ReRAM cells and methods for forming the cells that have a specific range of maximum field values of switching layer-to-electrode interfaces. Specifically, the values of the maximum field may be less than about 0.25 at one or both switching layer-to-electrode interfaces in a cell or, more specifically, less than about 0.22 or even less than about 0.20. These values result in high yields and robust performance of ReRAM cells. Mobility of defects within the resistive switching layer and through the layer-to-electrode interface is controlled in a manner different from conventional ReRAM cells that include, for example, a hafnium oxide switching layer disposed between titanium nitride and n-doped polysilicon electrodes.

Electrode and resistive switching materials for the proposed ReRAM cells are selected based on their individual material characteristics. A combined effect of these characteristics is considered in order to form interfaces with specified values of the maximum filed. For purposes of this disclosure, the maximum field is calculated based on the following equation:

$$E_{MAX} = -2*(WF-X)/\in_S|^{1/2},$$

where WF is a work function of the doped tantalum nitride, X is an electronic affinity of the resistive switching materials, and $\in_S$ is a dielectric permittivity of the resistive switching material.

As such, the material selection also depends on the dielectric permittivity of the resistive switching material. The difference between work function and the electron affinity of the two interfacing materials, which is sometimes referred to as a built-in voltage of the interface, is considered. This built-in voltage creates a stress at the interface that exacerbates various failure mechanisms and should be generally kept to a minimum. For example, a large built-in voltage can cause injection of positive ions (e.g., metal ions) into a resistive switching layer, which may impact its endurance. It has been found that large built-in voltages can negatively impact yields. The overall criteria for material selection are further described below with reference to FIGS. 4A-4D.

As stated above, different material characteristics should be considered to form interfaces with such low maximum field values. Specifically, electrode materials generally need to have low work functions, such as less than 4.75 eV or, more specifically, less than 4.50 eV. Some suitable examples include doped tantalum nitride, n-doped polysilicon and titanium nitride. Examples of dopants for the tantalum nitride include lanthanum, aluminum, erbium yttrium, and terbium. However, conventionally used platinum electrodes may have too large of a work function (in comparison to the proposed electrodes) and may not be suitable for the proposed ReRAM cells. For example, coupling a titanium nitride electrode with a niobium oxide resistive switching layer yields the maximum field of 0.183, while coupling a platinum electrode with the same niobium oxide resistive switching layer yields the maximum field of 0.285.

Furthermore, resistive switching materials generally need to have sufficiently large dielectric permittivity (e.g., at least about 30) and electron affinity (e.g., at least about 3.0 eV). Continuing with the above example, coupling a titanium nitride electrode with an aluminum oxide resistive switching layer, which has an electron affinity of only 1.0 eV and dielectric permittivity of only 9, yields a maximum field of 0.894.

As such, only a few specific combinations of materials yield desirable maximum field values. For example, combining resistive switching layers formed from hafnium oxide, niobium oxide, tantalum oxide, and aluminum oxide with electrodes formed from n-doped polysilicon, titanium nitride, ruthenium, iridium, platinum, and tantalum nitride results in twenty four different combinations, yet only five of these combinations have the maximum field values less than 0.25. These five combinations include the niobium oxide resistive switching layer coupled with the n-doped polysilicon electrode, the niobium oxide resistive switching layer coupled with the titanium nitride electrode, the niobium oxide resistive switching layer coupled with the ruthenium electrode, the niobium oxide resistive switching layer coupled with the iridium electrode, and finally the niobium oxide resistive switching layer coupled with the tantalum nitride electrode. Some notable exceptions from this list of five include (i.e., the combinations that have the maximum field values greater than 0.25), the niobium oxide resistive switching layer coupled with the platinum electrode, the hafnium oxide resistive switching layer coupled with the n-doped polysilicon electrode, and the hafnium oxide resistive switching layer coupled with the titanium nitride electrode.

While doped tantalum nitride is not included in the above example, it is another suitable electrode material. This material may be represented by the general formula of $Ta_X(Dopant)_yN$, where X is at least about 0.95. Some examples of dopants include lanthanum, aluminum, erbium yttrium, or terbium. Specific examples include $Ta_{0.95}Er_{0.05}N_y$, and $Hf_{0.8}Tb_{0.2}N_y$.

Examples of Re-RAM Cells and their Switching Mechanisms

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages.

A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

As stated above, resistance switching layer 104, which is made of a dielectric material, can be made to conduct through one or more filaments or conduction paths formed by applying a certain voltage. To provide this resistive switching functionality, resistance switching layer 104 includes a certain concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sublattice and a change in the electronic conductivity. In this example, the polarity of the pulse used to perform this change determines the direction of the change, i.e., reduction or oxidation. Other resistive switching mechanisms include bipolar electrochemical metallization mechanism and thermochemical mechanism, which leads to a change of the stoichiometry due to a current-induced increase of the temperature.

Figure 1B:
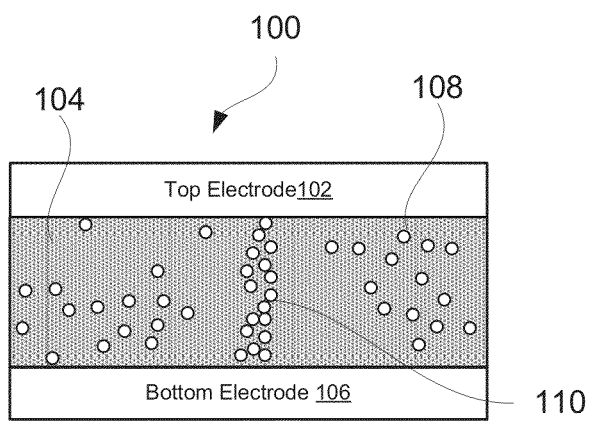

Without being restricted to any particular theory, it is believed that defects 108 can be reoriented within resistance switching layer 104 to form filaments or conduction paths as, for example, schematically shown in FIG. 1B as element 110. This reorientation of defects 108 occurs when a voltage for this type of resistance switching layer 104 is applied to electrodes 102 and 106. Sometimes, reorientation of defects 108 is referred to as filling the traps by applying a set voltages (and forming one or more filaments or conduction paths) and emptying the traps by applying a reset voltage (and breaking the previously formed filaments or conduction paths).

Defects 108 can be introduced into resistance switching layer 104 during or after its fabrication. For example, a certain concentration of oxygen deficiencies can be introduced into metal oxides during their deposition or during subsequent annealing. Physical vapor deposition (PVD) and atomic layer deposition (ALD) techniques may be specifically tuned to include particular defects 108 and their distribution within resistance switching layer 104.

Setting and resetting operations may be repeated multiple times as will now be described with reference to FIGS. 2A and 2B.

Figure 2A:
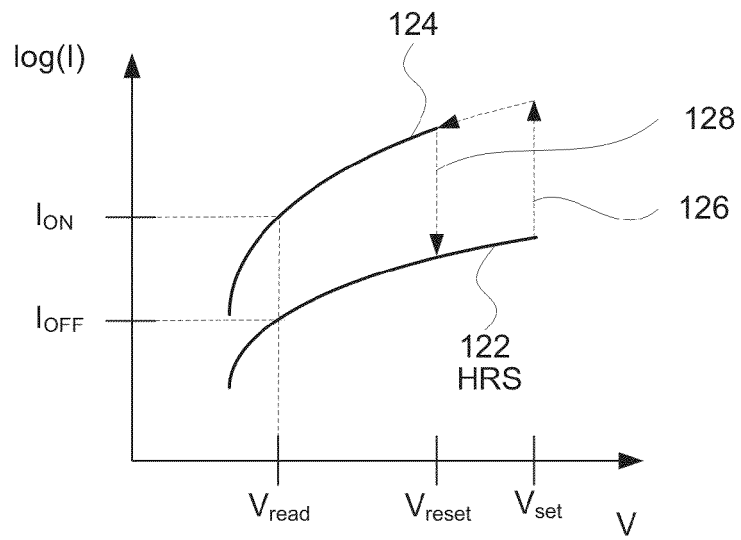
FIG. 2A illustrates a plot of a current passing through a unipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to switch ReRAM cell 100 into a different logic state, ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistance switching layer 104 and switches ReRAM cell 100 from its HRS to LRS as indicated by dashed line 126. It should be noted that formation or breaking of filaments or conduction paths in resistance switching layer 104 may also involve forming or breaking electronic connections between these filaments and one (e.g., reactive electrode) or both electrodes. The overarching concern is passage of the current between the two electrodes.

In LRS, the resistance characteristics of ReRAM cell 100 are represented by line 124. In this LRS, when the read voltage ($V_{READ}$) is applied to electrodes 102 and 106, the external read and write circuitry will sense the resulting "ON" current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation and should be distinguished from set operation during which ReRAM cell 100 is switched from its HRS to LRS. During the reset operation, a reset voltage (VRESET) is applied to ReRAM cell 100 to break the previously formed filaments or conduction paths in resistance switching layer 104 and switches ReRAM cell 100 from its LRS to HRS as indicated by dashed line 128. Reading of ReRAM cell 100 in its HRS is described above. Overall, ReRAM cell 100 may be switched back and forth between its LRS and HRS many times. Read operations may be performed in each of these states (between the switches) one or more times or not performed at all. It should be noted that application of set and reset voltages to change resistance states of the ReRAM cell involves complex mechanisms that are believed to involve localized resistive heating as well as mobility of defects impacted by both temperature and applied potential.

Figure 2B:
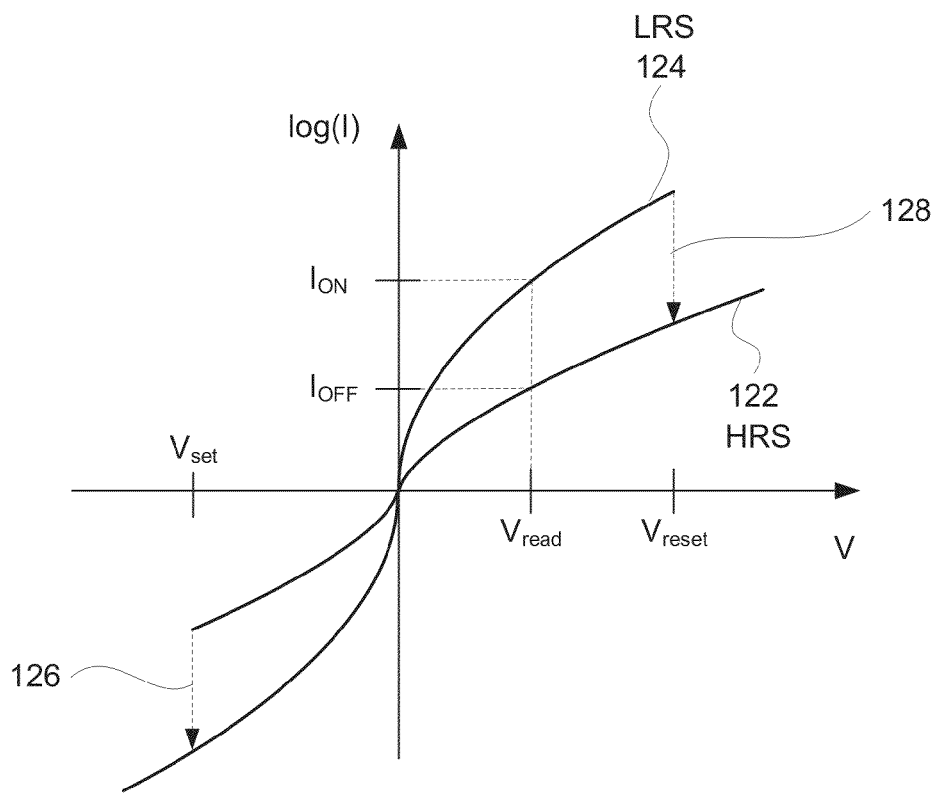
FIG. 2B illustrates a plot of a current passing through a bipolar ReRAM cell as a function of a voltage applied to the ReRAM cell, in accordance with some embodiments.

ReRAM cell 100 may be configured to have either unipolar switching as shown in FIG. 2A or bipolar switching as shown in FIG. 2B. The cells that have the same polarity of set and reset voltages are referred to as unipolar cells, while the cells that have different polarities of h set and reset voltages are referred to as bipolar cells. In general, the unipolar switching may not depend on the polarity of the set voltage and reset voltage.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the current during reading and writing operations may be less than about 5 µA or, more specifically, is less than about 1 µA. The length of read voltage pulse ($t_{READ}$) may be comparable to the length of the corresponding set voltage pulse ($t_{SET}$) or may be shorter than the write voltage pulse ($t_{SET}$).

A ratio of currents generated during set and reset operations may be at least about 5 or, more specifically, at least about 10 to make the state of ReRAM cell easier to determine. ReRAM cells should be able to cycle between LRS and HRS between at least about 10^3 times or, more specifically, at least about 10^7 times without failure. A data retention time ($t_{RET}$) should be at least about 5 years or, more specifically, at least about 10 years at a thermal stress up to 85° C. and small electrical stress, such as a constant application of the read voltage ($V_{READ}$).

In some embodiments, the same ReRAM cell may include two or more resistance switching layers interconnected in series. Adjacent resistance switching layers may directly interface each other or be separated by an intermediate layer.

In some embodiments, a ReRAM cell is subjected to a forming operation, during which the initially insulating properties of the resistance switching layer are altered and the ReRAM cell is configured into the initial LRS or HRS. The forming operation may include a very short high discharge current peak, which is used to set the LRS level of the resistance switching layer for subsequent switching as outlined above. In this case, a resistance switching layer with very low levels (e.g., 100-30 kOhm) of resistance in the LRS may be limited in terms of scaling down. This difficulty may be resolved by positioning such resistance switching layers in series with other components providing additional resistance to the overall ReRAM cell.

ReRAM Cell Components and their Characteristics

Figure 3:
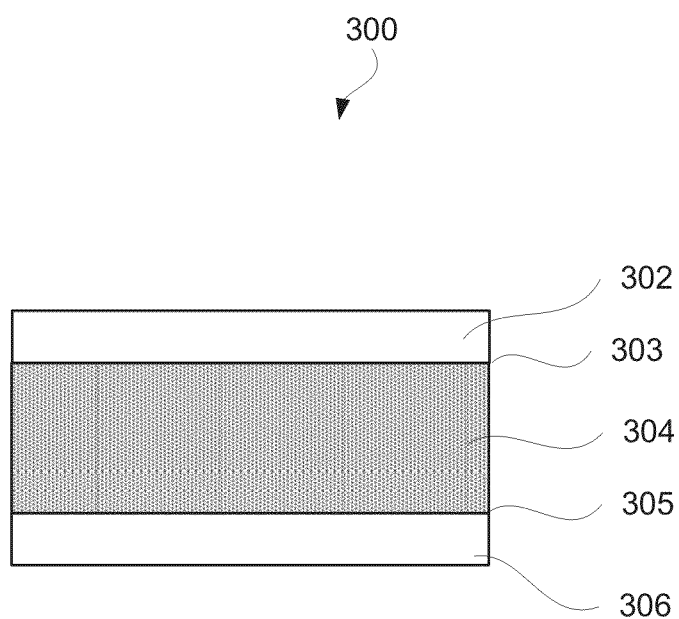
FIG. 3 illustrates a schematic representation of a ReRAM cell, in accordance with some embodiments.

FIG. 3 illustrates a schematic representation of ReRAM cell 300, in accordance with some embodiments. ReRAM cell 300 includes a first electrode 302, a resistive switching layer 304, and a second electrode 306. First electrode 302 and resistive switching layer 304 form first interface 303, while second electrode 306 and resistive switching layer 304 form second interface 305. One or both interfaces 303 and 305 may have a maximum field of less than about 0.25 or, more specifically, less than about 0.22, for example, less than 0.20. In some embodiments, only one of the two interface 303 and 305 has such a value of its maximum field. The other interface may have a maximum field value of greater than about 0.25. In some embodiments, one electrode does not form a direct interface with the resistive switching layer and, instead, is separated by other layers, such as a barrier layer, coupling layer, and the like.

One or both electrodes 302 and 306 may be made from materials that have low work functions, such as less than about 4.75 eV or, more specifically, less than about 4.50 eV. For purposes of this document, the work function is defined as the minimum energy needed to remove an electron from a solid to a point immediately outside the solid surface, e.g., the minimum energy needed to move an electron from the Fermi level into vacuum. The work function is a characteristic property for any solid having a conduction band, whether the conduction band is empty or partly filled. For conductive materials used as electrodes, the Fermi level is typically inside the conduction band, indicating that the band is partly filled. For insulators, the Fermi level lies within the band gap, indicating an empty conduction band.

Some examples of suitable electrode materials include n-doped polysilicon (4.6 eV work function), titanium nitride (4.3 eV work function), tantalum nitride (4.3 eV work function), aluminum (4.08 eV work function). Another example includes doped tantalum nitride, which may be represented general formula of $Ta_X(Dopant)_YN$, where X is at least about 0.95. Some examples of dopants include lanthanum, aluminum, erbium yttrium, or terbium. Specific examples include $Ta_{0.95}Er_{0.05}N_Y$ and $Hf_{0.8}Tb_{0.2}N_y$.

In some embodiments, one or both electrodes have thicknesses of between about 5 Angstroms and 1,000 Angstroms, such as between about 50 Angstroms and 500 Angstroms. Various techniques of forming such electrodes are described below with reference to FIG. 5.

Resistive switching layer 304 may be formed from materials that have a large dielectric permittivity, such as at least about $30*\in_0$ or, more specifically, at least about $40*\in_0$, where $\in_0$ is the absolute permittivity of vacuum ($8.85 \times 10^{-12}$ F/m). Furthermore, materials selected for resistive switching layer 304 may have a large electron affinity, such as at least about 3.5 eV or, more specifically, at least about 4.0 eV. For purposes of this document, the dielectric permittivity is a measure of the resistance that is encountered when forming an electric field in the dielectric material. In other words, the dielectric permittivity corresponds to how much electric flux is generated per unit charge in the dielectric and relates to the dielectric's ability to transmit (i.e., "permit") an electric field. The electron affinity is defined as the amount of energy released when an electron is added to a neutral atom or molecule to form a negative ion. More specifically, in resistive switching layers that are formed from solid materials, the electron affinity is the energy difference between the vacuum energy and conduction band minimum.

Some examples of suitable resistive switching materials include niobium oxide, tantalum oxide, lanthanum oxide, and lanthanum aluminum oxide. In some embodiments, the resistive switching layer has a thickness of between about 10 Angstroms and 100 Angstroms. Various techniques of forming such resistive switching materials are described below with reference to FIG. 5.

Some examples of material combinations that form a suitable interface (from the maximum field perspective) include niobium oxide and doped tantalum nitride, niobium oxide and n-doped polysilicon, niobium oxide and titanium nitride, niobium oxide and ruthenium, niobium oxide and iridium, niobium oxide and tantalum nitride. In some embodiments, a ReRAM has two such interfaces. For example, a cell may include an interface formed by niobium oxide and doped tantalum nitride and another interface formed by niobium oxide and titanium nitride. Various characteristics of different materials before and after forming an interface will now be described with reference to FIGS. 4A-4D. It should be noted that in these figures and description below the electrode and its parameters are labeled as "metal." One having ordinary skills in the art would understand that various kinds (metal and non-metal) of electrode materials may be used in ReRAM cells. The resistive switching material is labeled as "semiconductor".

Figure 4A:
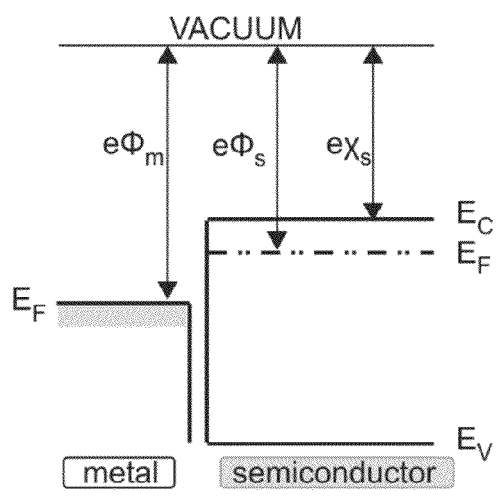
FIGS. 4A-4B illustrate graphs of various characteristics of an electrode, a resistive switching layer, and an interfaced formed by the electrode and resistive switching layer with and without bias, in accordance with some embodiments.
Figure 4B:
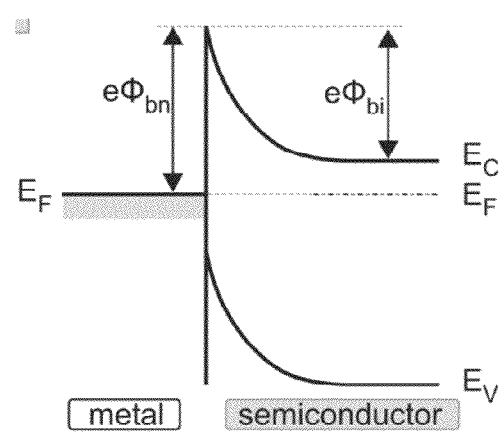

FIG. 4A is a schematic illustration of a metal and semiconductor before forming an interface. The figure shows a work function of the metal ($\Phi m$) and a work function of the semiconductor ($\Phi s$) in accordance with the definitions provided above. It also illustrates the electron affinity of the semiconductor ($Xs$). FIG. 4B illustrates the characteristics of the interface formed by these metal and semiconductor materials. Specifically, it shows the barrier height ($\Phi bn$) and built-in voltage ($\Phi bi$). The built-in voltage may be approximated as the difference between the work function of the metal ($\Phi m$) and the electron affinity of the semiconductor ($Xs$). As stated above, it may be desirable to have an electrode with a low work function and have a resistive switching with a high electron affinity in order to reduce the built-in voltage at the interface The maximum field can be calculated according to the following equation:

$$E_{max} = |(2\Phi bi/\in_s)^{1/2}| = |(2(\Phi m - Xs)/\in_s)^{1/2}|,$$

where $\in_x$—is the dielectric permittivity of the insulator. This equation assumes that oxygen vacancies and dopants are substantially immobile in the semiconductor. This equation was used to calculate the maximum field values for various combinations of electrode and resistive switching materials. The results are presented in Table 1.

TABLE 1

|  | N + poly | TiN | Ru | Ir | Pt | TaN | $Ta_{0.95}Er_{0.05}N_y$ |
|---|---|---|---|---|---|---|---|
| HfOx | 0.438 | 0.410 | 0.456 | 0.465 | 0.498 | 0.410 | 0.410 |
| NbOx | 0.218 | 0.183 | 0.239 | 0.249 | 0.285 | 0.183 | 0.183 |
| TaOx | 0.322 | 0.285 | 0.344 | 0.355 | 0.394 | 0.285 | 0.285 |
| AlOx | 0.894 | 0.856 | 0.919 | 0.931 | 0.978 | 0.856 | 0.856 |

Processing Examples

Figure 5:
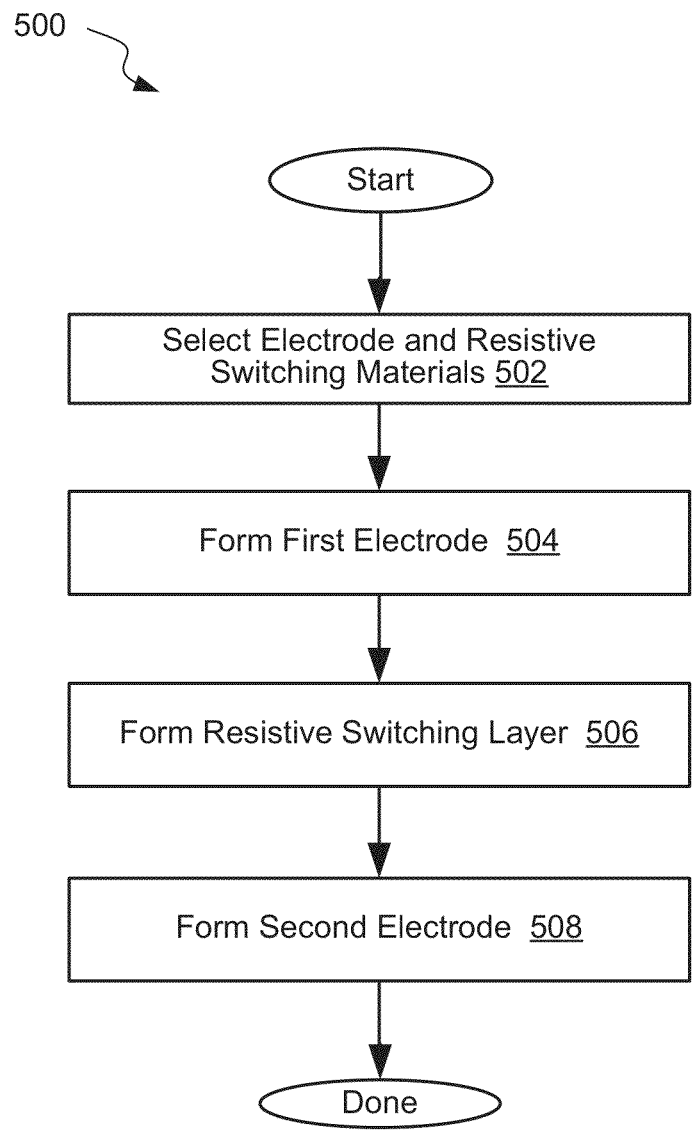
FIG. 5 illustrates a process flowchart corresponding to a method for forming a ReRAM cell, in accordance with certain embodiments.

FIG. 5 illustrates a process flowchart corresponding to a method 500 for forming a ReRAM cell, in accordance with some embodiments. The ReRAM cell may include a first layer operable as one electrode, a second layer operable as a resistive switching layer, and a third layer operable as another electrode as described above. Although certain processing techniques and process parameters are described, it is understood that various other techniques and modifications of the techniques may also be used. Method 500 may commence with selecting an electrode material for the first layer and a resistive switching material for the second layer during operation 502. The materials are selected in such as a way that the interface to be formed later between these layers will have a maximum field of less than about 0.25 or some other value specified above. In some embodiments, operation 502 also includes selecting an electrode material for the third layer. Various material properties are considered during this operation, including work functions, electronic affinities, and dielectric permittivities.

Method 500 may proceed with operation 504, during which the first layer is formed. The first layer may include a selected electrode material, which in some embodiments may be titanium nitride. The titanium nitride electrode may be formed using PVD or another process described above. Specifically, a titanium target may be bombarded at 150-500 W with a pressure of 2-10 mTorr in the nitrogen environment. The duration of the bombardment can determine the thickness of the electrode. Other processing techniques, such as Atomic Layer Deposition (ALD), Pulsed Layer Deposition (PLD), and Chemical Vapor Deposition (PVD), evaporation, etc. can also be used to deposit the first layer.

An electrode containing doped tantalum nitride may be deposited in a similar manner, e.g., using PVD, ALD, PLD, and CVD. Dopants may be added into the electrode during deposition of tantalum nitride or after. Various doping techniques will apparent to one having skills in the art.

Method 500 may proceed with operation 506, during which the second layer is formed. The second layer includes a selected resistive switching material. For example, a layer of niobium oxide can be formed by reactive sputtering a niobium target in an oxygen containing atmosphere or by sputtering a niobium oxide target. A power of 100-1000 Watts and a 20-60% oxygen atmosphere may be used for reactive sputtering. As another example, using ALD, a niobium precursor, such as bis(cyclopentadienyl)niobium dichloride ($C_{10}H_{10}Cl_2Nb$), can be injected into the ALD chamber together with a suitable oxidant, such as water, oxygen plasma, or ozone. Other deposition techniques, such as PLD, CVD, or evaporation can also be used. Deposition of the second layer forms an interface with the first layer, which may or may not meet the maximum field values listed above. If this interface does not meet the specified maximum field value, then another interface formed between the second layer and the third layer does.

Method 500 may proceed with operation 508, during which the third layer is formed. The first layer may be formed in a manner similar to the firs layer described above.

Experimental Results

A series of experiments was conducted to determine correlations between yields and maximum field values of different interfaces formed by electrodes and resistive switching layers. For purposes of this document, the yield is defined as a ratio of ReRAM cells exhibiting resistive switching after their fabrication relative to all fabricated cells. Three sets of test samples have been used, all including titanium nitride top electrodes and n-doped polysilicon bottom electrodes. The first set also included aluminum oxide resistance switching layers, the second set included hafnium oxide resistance switching layers, and the third set included niobium oxide resistance switching layers. As such, the first set included one interface formed by aluminum oxide and titanium nitride, which has the maximum field of 0.856, and another interface formed by aluminum oxide and n-doped polysilicon, which has the maximum field of 0.894. The second set included one interface formed by hafnium oxide and titanium nitride, which has the maximum field of 0.410, and another interface formed by hafnium oxide and n-doped polysilicon, which has the maximum field of 0.438. Finally, the third set included one interface formed by niobium oxide and titanium nitride, which has the maximum field of 0.183, and another interface formed by niobium oxide and n-doped polysilicon, which has the maximum field of 0.218. The yield was substantially higher for the third set than for the first and second sets by at least 25% and 10%, respectively. Furthermore, the yield for the second set was much higher than for the first set. As, such the yield improved as the maximum field values decrease.

Memory Array Examples

Figure 6A:
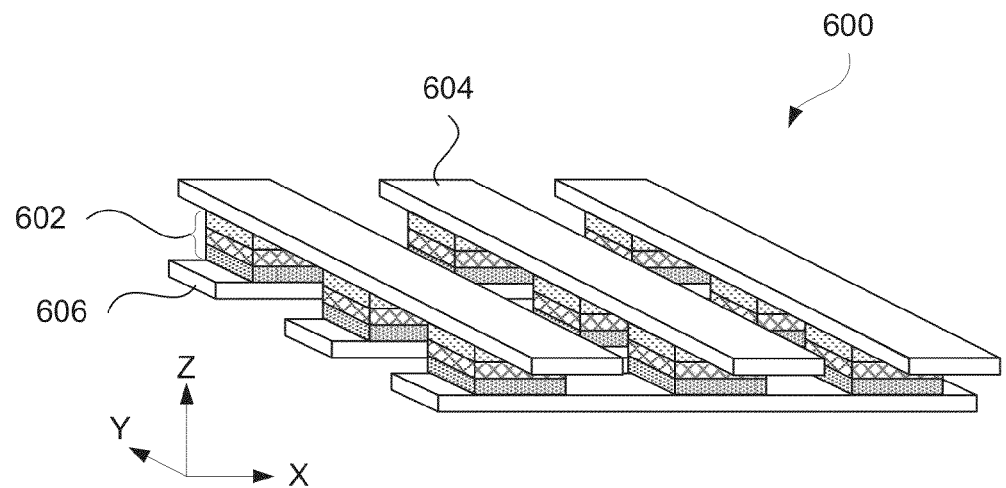
FIGS. 6A and 6B illustrate schematic views of memory arrays including multiple ReRAM cells, in accordance with some embodiments.

A brief description of memory arrays will now be described with reference to FIGS. 6A and 6B to provide better understanding to various aspects of thermally isolating structures provided adjacent to nonvolatile memory elements and, in some examples, surrounding the nonvolatile memory elements. Nonvolatile memory elements described above may be used in memory devices or larger integrated circuits (IC) that may take a form of arrays. FIG. 6A illustrates a memory array 600 including nine nonvolatile memory elements 602, in accordance with some embodiments. In general, any number of nonvolatile memory elements may be arranged into one array. Connections to each nonvolatile memory element 602 are provided by signal lines 604 and 606, which may be arranged orthogonally to each other. Nonvolatile memory elements 602 are positioned at crossings of signal lines 604 and 606 that typically define boundaries of each nonvolatile memory element in array 600.

Signal lines 604 and 606 are sometimes referred to as word lines and bit lines. These lines are used to read and write data into each nonvolatile memory element 602 of array 600 by individually connecting nonvolatile memory elements to read and write controllers. Individual nonvolatile memory elements 602 or groups of nonvolatile memory elements 602 can be addressed by using appropriate sets of signal lines 604 and 606. Each nonvolatile memory element 602 typically includes multiple layers, such as top and bottom electrodes, resistance switching layer, embedded resistors, embedded current steering elements, and the like, some of which are further described elsewhere in this document. In some embodiments, a nonvolatile memory element includes multiple resistance switching layers provided in between a crossing pair of signal lines 604 and 606.

As stated above, various read and write controllers may be used to control operations of nonvolatile memory elements 602. A suitable controller is connected to nonvolatile memory elements 602 by signal lines 604 and 606 and may be a part of the same memory device and circuitry. In some embodiments, a read and write controller is a separate memory device capable of controlling multiple memory devices each one containing an array of nonvolatile memory elements. Any suitable read and write controller and array layout scheme may be used to construct a memory device from multiple nonvolatile memory elements. In some embodiments, other electrical components may be associated with the overall array 600 or each nonvolatile memory element 602. For example, to avoid the parasitic-path-problem, i.e., signal bypasses by nonvolatile memory elements in their low resistance state (LRS), serial elements with a particular non-linearity must be added at each node or, more specifically, into each element. Depending on the switching scheme of the nonvolatile memory element, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 6B:
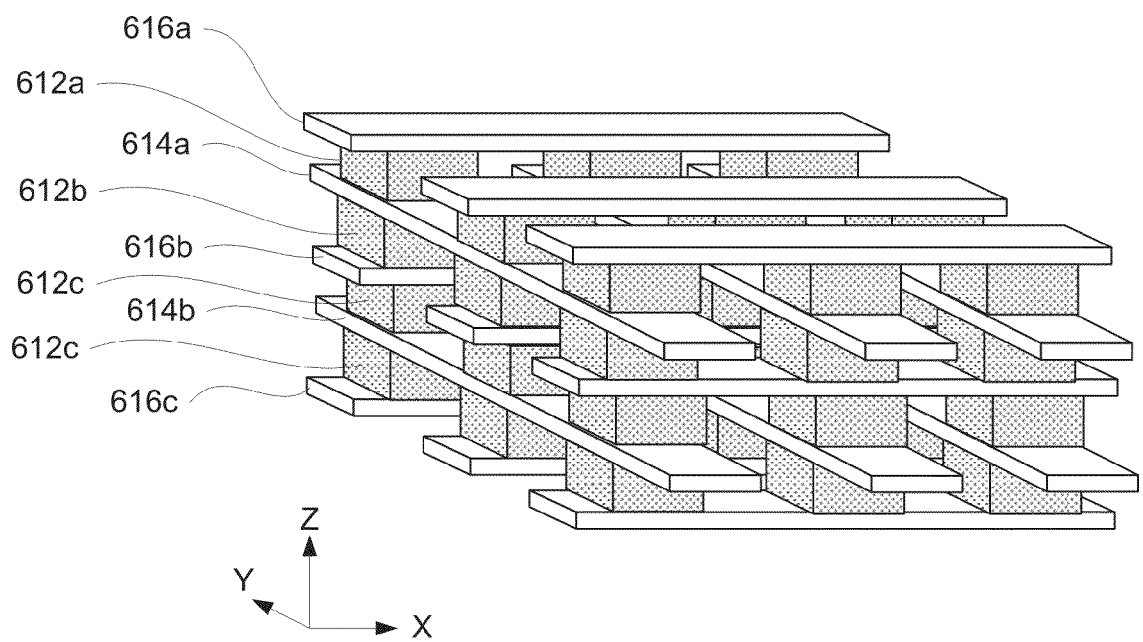

In some embodiments, a memory device may include multiple array layers as, for example, illustrated in FIG. 6B. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual nonvolatile memory element.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A resistive random access memory cell comprising:
    a first layer comprising a doped tantalum nitride having a first work function (WF),
        wherein the doped tantalum nitride comprises a dopant, the dopant being one of lanthanum, erbium, yttrium, or terbium;
    a second layer comprising a resistive switching material having an electron affinity (X) and a dielectric permittivity ($\in_s$), wherein the resistive switching comprises niobium oxide; and
    a first interface formed between the first layer and the second layer.

2. The resistive random access memory cell of claim 1, wherein the doped tantalum nitride is represented by a general formula of $Ta_X$ $(Dopant)_Y$ N, where X is at least about 0.95, and wherein Y is greater than 0.

3. The resistive random access memory cell of claim 1, wherein the first work function of the doped tantalum nitride is less than 4.5 eV.

4. The resistive random access memory cell of claim 1, wherein the dielectric permittivity of the resistive switching material is at least 30 and less than 100.

5. The resistive random access memory cell of claim 1, wherein the electron affinity of the resistive switching material is at least 3.5 eV and less than 10 eV.

6. The resistive random access memory cell of claim 1, further comprising:
a third layer comprising an electrode material having a second work function; and
a second interface formed by the second layer and the third layer,
wherein a second maximum field of the second interface has a value of less than 0.25.

7. The resistive random access memory cell of claim 6, wherein the electrode material of the third layer comprises one of n-doped poly-silicon, titanium nitride, or tantalum nitride.

8. The resistive random access memory cell of claim 6, wherein the electrode material of the third layer is the doped tantalum nitride.

9. The resistive random access memory cell of claim 6, wherein the electrode material of the third layer is different from the doped tantalum nitride.

10. The resistive random access memory cell of claim 9, wherein the work function of the doped tantalum nitride is between 4.2 and 4.4 eV.

11. The resistive random access memory cell of claim 10, wherein the resistive switching material comprises niobium oxide.

12. The resistive random access memory cell of claim 1, wherein the first layer has a thickness of between 5 Angstroms and 1,000 Angstroms.

13. The resistive random access memory cell of claim 1, wherein the second layer has a thickness of between 10 Angstroms and 100 Angstroms.

14. A resistive random access memory cell comprising:
a first layer comprising a doped tantalum nitride,
wherein the doped tantalum nitride comprises a dopant, the dopant being one of lanthanum, erbium, yttrium, or terbium; and
a second layer comprising a resistive switching material selected from one of niobium oxide, lanthanum oxide, or lanthanum aluminum oxide,
the second layer forming a first interface with the first layer.

15. The resistive random access memory cell of claim 14, further comprising:
a third layer operable as an electrode and comprising one of n-doped poly-silicon, titanium nitride, tantalum nitride, or aluminum, the second layer forming a second interface with the third layer.

16. The resistive random access memory cell of claim 15, wherein the resistive switching material comprises niobium oxide, and wherein the third layer comprises titanium nitride.

17. The resistive random access memory cell of claim 14, wherein a first interface formed between the first layer and the second layer has a value of a maximum field of less than 0.25, where WF is a work function of the doped tantalum nitride, X is an electron affinity of the resistive switching materials, and $E_s$ is a relative dielectric permittivity of the resistive switching material.

18. The resistive random access memory cell of claim 1, wherein the dopant of the doped tantalum nitride is erbium.

19. The resistive random access memory cell of claim 1, wherein the doped tantalum nitride is $Ta_{0.95}Er_{0.05}N_y$.

* * * * *